United States Patent
Yamamoto et al.

(10) Patent No.: US 7,915,623 B2
(45) Date of Patent: Mar. 29, 2011

(54) LIGHT-EMITTING DIODE ARRAY, LIGHT-EMITTING DIODE, AND PRINTER HEAD

(75) Inventors: Hironori Yamamoto, Tottori (JP); Hajime Kimachi, Unnan (JP)

(73) Assignees: Sanyo Electric Co., Ltd., Moriguchi-shi (JP); Tottori Sanyo Electric Co., Ltd., Tottori-shi (JP)

( * ) Notice: Subject to any disclaimer, the term of this patent is extended or adjusted under 35 U.S.C. 154(b) by 838 days.

(21) Appl. No.: 10/594,442

(22) PCT Filed: Mar. 18, 2005

(86) PCT No.: PCT/JP2005/004976
§ 371 (c)(1),
(2), (4) Date: Jun. 19, 2007

(87) PCT Pub. No.: WO2005/093859
PCT Pub. Date: Oct. 6, 2005

(65) Prior Publication Data
US 2007/0278505 A1  Dec. 6, 2007

(30) Foreign Application Priority Data
Mar. 29, 2004  (JP) ................................ 2004-094537

(51) Int. Cl.
*H01L 33/00* (2010.01)
(52) U.S. Cl. ................. 257/91; 257/79; 257/88; 257/94; 257/95; 257/96; 257/97; 257/98; 257/99; 257/E33.005; 257/E33.059; 257/E33.062; 257/E33.065; 257/E33.067; 257/E33.068

(58) Field of Classification Search ................... 257/79, 257/88, 91, 94, 95, 96, 97, 98, 99, E33.005, 257/E33.012, E33.059, E33.062, E33.065, 257/E33.067, E33.068
See application file for complete search history.

(56) References Cited

U.S. PATENT DOCUMENTS

| 4,984,035 | A | * | 1/1991 | Kanzawa et al. | ............... 257/93 |
| 5,196,718 | A | * | 3/1993 | Sasagawa | ........................ 257/88 |
| 5,260,588 | A |   | 11/1993 | Ohta | |
| 5,406,095 | A | * | 4/1995 | Koyama et al. | ................. 257/88 |
| 5,880,487 | A | * | 3/1999 | Furukawa et al. | ............... 257/99 |

(Continued)

FOREIGN PATENT DOCUMENTS

JP  62-014480 A  1/1987

(Continued)

OTHER PUBLICATIONS

International Search Report of PCT/JP2005/004976 date of mailing Jun. 21, 2005.

*Primary Examiner* — Jerome Jackson, Jr.
*Assistant Examiner* — Jay C Kim
(74) *Attorney, Agent, or Firm* — Westerman, Hattori, Daniels & Adrian, LLP

(57) ABSTRACT

A light emitting diode array in which, when viewed from the above, the shape of an almost square light emitting diode is square-chamfered or round-chamfered at the corners thereof in order to minimize light leakage at a reverse mesa surface to allow an electrode layer to surround the three directions of a light emitting unit, and part in the vicinity of the corner of the reverse mesa surface is extended up to a substrate unit to cover it. Accordingly, the light emitting diode array minimized in light leakage at the reverse mesa surface can be provided.

4 Claims, 11 Drawing Sheets

U.S. PATENT DOCUMENTS

| | | | |
|---|---|---|---|
| 6,121,636 A * | 9/2000 | Morita et al. | 257/99 |
| 6,219,074 B1 * | 4/2001 | Chosa et al. | 347/130 |
| 6,724,068 B2 * | 4/2004 | Matsuyama | 257/618 |
| 6,730,936 B2 * | 5/2004 | Yukimoto | 257/88 |
| 6,847,055 B2 * | 1/2005 | Yabusaki et al. | 257/94 |
| 6,864,570 B2 * | 3/2005 | Smith | 257/703 |
| 2002/0070383 A1 * | 6/2002 | Shibata et al. | 257/76 |

FOREIGN PATENT DOCUMENTS

| | | |
|---|---|---|
| JP | 4-343484 A | 11/1992 |
| JP | 11-046017 A | 2/1999 |
| JP | 11-135837 A | 5/1999 |
| JP | 11-220162 A | 8/1999 |
| JP | 2002-94108 A | 3/2002 |

* cited by examiner

INVERTED MESA SURFACE

FORWARD MESA SURFACE

INVERTED MESA SURFACE

FORWARD MESA SURFACE

INVERTED MESA SURFACE

FORWARD MESA SURFACE

INVERTED MESA SURFACE

FORWARD MESA SURFACE

LIGHT-EMITTING DIODE ARRAY, LIGHT-EMITTING DIODE, AND PRINTER HEAD

TECHNICAL FIELD

The present invention relates to a light-emitting diode array and light-emitting diode used in a printer head or other components of an LED (light-emitting diode) printer, and particularly relates to a mesa-isolated monolithic light-emitting diode array, to a light-emitting diode, and to a printer head.

BACKGROUND ART

Printers have recently come to be used in a wider range of applications that is not limited to text and graphics, but also extends to photographic printing, and progressively higher levels of detail and clearly discernable printing are desired.

Enhanced printing precision is also desired in a light-emitting diode array used in the printer head of an LED printer, and techniques are being developed to meet the need for micro-fabrication and increased luminance of such light-emitting diode arrays.

However, the area of the light-emitting surface increases as a result of light leakage from the light-emitting portions of each of the plurality of light-emitting diodes that make up a light-emitting diode array when the light-emitting diode array is micro-fabricated and endowed with increased luminance. This light leakage significantly interferes with enhancing the degree of integration of the light-emitting diodes.

FIG. 9 is a schematic top view of a conventional mesa-isolated light-emitting diode array. This light-emitting diode array 101 is composed of a base 102 that includes a substrate, an N-electrode layer, a buffer layer, a distributed Bragg reflector layer, and an insulating film; a plurality of platform-shaped light-emitting units 103 that are isolated from each other by mesa etching and are provided to the upper surface portion; and P-electrode layers 104.

Each of light-emitting units 103 is square-shaped as viewed from above, and is configured so that a forward mesa surface and an inverted mesa surface are adjacent to each other at the corner portions on the four peripheral side surfaces of light-emitting units 103. The light-emitting units 103 are disposed at a prescribed interval in the transverse direction so that light emitting windows 111 in two positions thereof are adjacent to each other. P-electrode layers 104 are layers on the outside of the light-emitting units 103, are alternately drawn out in opposite directions at right angles to the positioning in the transverse direction of the light-emitting units 103 for each of the plurality of light-emitting diodes constituting the light-emitting diode array 101, and are connected to a bonding wide-area electrode.

FIG. 10 includes schematic views of the light-emitting diode, wherein FIG. 10A shows a top view of the light-emitting diode, and FIG. 10B is a perspective view of the same. In the light-emitting units 103, substantially square-shaped as viewed from above, mesa etching is performed so that the sides of the two light emitting windows 111 arranged in the transverse direction are inverted mesa surfaces, and the sides in the orthogonal direction are forward mesa surfaces.

The P-electrode layer 104 is I-beam-shaped as viewed from above, has the light emitting windows 111 in the open portions thereof, and extends from the center portion of the outside to form a bonding wide-area electrode. This P-electrode layer 104 also serves to block unnecessary light during light emission by the light-emitting unit 103 by covering the forward mesa surfaces on both sides and blocking light emitted from the forward mesa surfaces.

FIG. 11 is a top view showing the shape of the photomask 151 when the conventional light-emitting unit 103 is mesa-etched. The substantially square corners of the photomask 151 form right angles.

[Patent Reference 1]: Japanese Laid-open Patent Application No. 2001-177150

DISCLOSURE OF THE INVENTION

Problems the Invention is Intended to Solve

In the conventional light-emitting diode array 101, the forward mesa surfaces on both sides are covered by the P-electrode layer 104 as shown in FIGS. 10A and 10B in each light-emitting unit 103 of the plurality of light-emitting diodes constituting the light-emitting diode array 101, but the angle at which the inverted mesa surfaces rise from the base is less than vertical (smaller than 90 degrees). Therefore, a P-electrode layer is not formed on the inverted mesa surfaces during formation of the P-electrode layer.

The inverted mesa surfaces of the light-emitting units 103 therefore do not block the light emitted by the conventional light-emitting diode array 101. Accordingly, as shown in FIG. 10A, the range 120 of light leakage increases due to light leakage from the inverted mesa faces, producing a light source that is merged with the light emitting windows 111 and spread into a T-shape, rather than a spot light source.

When a light-emitting diode array 101 composed of this type of conventional light-emitting diodes is used as the head of an LED printer, for example, drawbacks occur in that the aforementioned light leakage causes bleeding or blurring to occur at the borders of printed text and other characters, or at the borders of photographs and other images, and a clear finished product is not obtained.

Increasing the degree of integration of the light-emitting diode array also leads to drawbacks in that the light from separate light-emitting diodes combines due to light leakage, and the light-emitting diodes no longer function as spot light sources. It is therefore impossible to increase the degree of integration.

In order to overcome these drawbacks, an object of the present invention is to provide a light-emitting diode array, a light-emitting diode, and a printer head whereby light leakage from the inverted mesa surface of a light-emitting diode can be reduced, the light source can be made to resemble a spot light source, and high precision and high integration can be realized.

Means for Solving the Abovementioned Problems

The light-emitting diode array according to claim 1 comprises a plurality of platform-shaped light-emitting units formed so as to be isolated from each other by etching on a surface of a substrate of layered PN layers, wherein in each of the plurality of platform-shaped light-emitting units formed so as to be isolated from each other, corners of the light-emitting units having a substantially square shape as viewed from above are provided with a beveled shape.

The light-emitting diode array according to claim 2 is the light-emitting diode array according to claim 1, wherein the beveled shape of the corners is an angle-beveled shape or a round-beveled shape.

The light-emitting diode array according to claim 3 is the light-emitting diode array according to claim 1 or 2, wherein an electrode layer or light-blocking film provided to each of the light-emitting units surrounds three sides, as viewed from above, of a light emitting window of each of the plurality of light-emitting units, and covers portions of a reverse mesa surface near the corners over an area that extends to a base.

The "three sides" referred to herein refer to a surface formed so as to wrap around a portion of the upper surface on the forward mesa surfaces that are a pair of opposing side surfaces, and in the areas near the corners of the inverted mesa surfaces that are a pair of opposing side surfaces adjacent to the forward mesa surfaces.

The light-emitting diode according to claim 4 has a light-emitting unit wherein a pair of opposing surfaces from among the four peripheral side surfaces have surfaces that tilt outward from top to bottom; a pair of opposing side surfaces adjacent to the pair of opposing side surfaces from among the four peripheral side surfaces have surfaces that tilt inward from top to bottom; each of four corners of the four peripheral side surfaces is beveled; and an electrode is formed on each surface tilted outward from top to bottom of the pair of opposing side surfaces, and an electrode is also formed in wraparound fashion near corners of each surface tilted inward from top to bottom of the pair of opposing side surfaces adjacent to the pair of opposing side surfaces, so as to connect to the electrode provided to each surface tilted outward from top to bottom of the pair of opposing side surfaces.

In the light-emitting diode array or light-emitting diode according to the present invention, the shape of the corners of the light-emitting units may be selected according to the shape of a mask pattern used for etching.

As described in claim 5, the light-emitting diode array or light-emitting diode configured as described above may be provided as the light source of a printer head.

EFFECT OF THE INVENTION

In the light-emitting diode array according to claim 1, in each of the plurality of platform-shaped light-emitting units formed so as to be isolated from each other, corners of the light-emitting units having a substantially square shape as viewed from above are provided with a beveled shape. Therefore, an electrode layer or light-blocking film can be wrapped around the corners when an electrode layer or light-blocking film is formed, enabling the corners to be covered by the electrode layer or light-blocking film and light leakage from the corners to be eliminated.

In the light-emitting diode array according to claim 2, the beveling of the corners is in an angle-beveled shape or a round-beveled shape, whereby the corners can be covered by an electrode layer or light-blocking film during formation of the electrode layer using a simple etching mask pattern, and light leakage from the corners can be eliminated.

In the light-emitting diode array according to claim 3, since an electrode layer or light-blocking film provided to each of the plurality of light-emitting units surrounds three sides as viewed from above of a light emitting window of each of the plurality of light-emitting units and extends to the mesa surfaces and a base at the bottom of the mesa surfaces, light is prevented from emanating from the forward mesa surfaces, the beveled portion at the corners, and the upper surface other than the area of the light emitting window. Light can also be prevented from leaking from the forward mesa surfaces, the corner portions, and the upper surface other than the area of the light emitting window of the light-emitting diode.

The light-emitting diode according to claim 4 has a light-emitting unit in which an electrode is formed on each surface tilted outward from top to bottom of a pair of opposing side surfaces among four peripheral side surfaces, and an electrode is also formed in wraparound fashion near corners of each surface tilted inward from top to bottom of the pair of opposing side surfaces adjacent to the pair of opposing side surfaces, so as to connect to the electrode provided to each surface tilted outward from top to bottom of the pair of opposing side surfaces. Therefore, in this light-emitting diode, the upper surface, each of a pair of opposing side surfaces, and the areas near the corners of each of the pair of opposing side surfaces adjacent to the pair of opposing side surfaces can be covered by the electrode, and light can be prevented from leaking from these surfaces.

A configuration is adopted whereby the shape of the corners of the light-emitting unit can be selected according to the shape of an etching mask pattern in the light-emitting diode array or light-emitting diode according to the present invention. There is therefore no need to add more steps to the conventional fabrication process, and it is possible to freely select a corner shape for the light-emitting diode that is optimal for the conditions of the manufacturing process.

BRIEF DESCRIPTION OF THE DRAWINGS

FIG. 2 includes schematic views of the light-emitting diode according to the present invention; wherein

FIG. 3 includes schematic partial sectional views of the fabrication process of the light-emitting diode according to the present invention; wherein

FIG. 4 includes schematic partial sectional views of the fabrication process of the light-emitting diode according to the present invention; wherein

FIG. 10 includes schematic views of a conventional light-emitting diode; wherein

Figure 1:
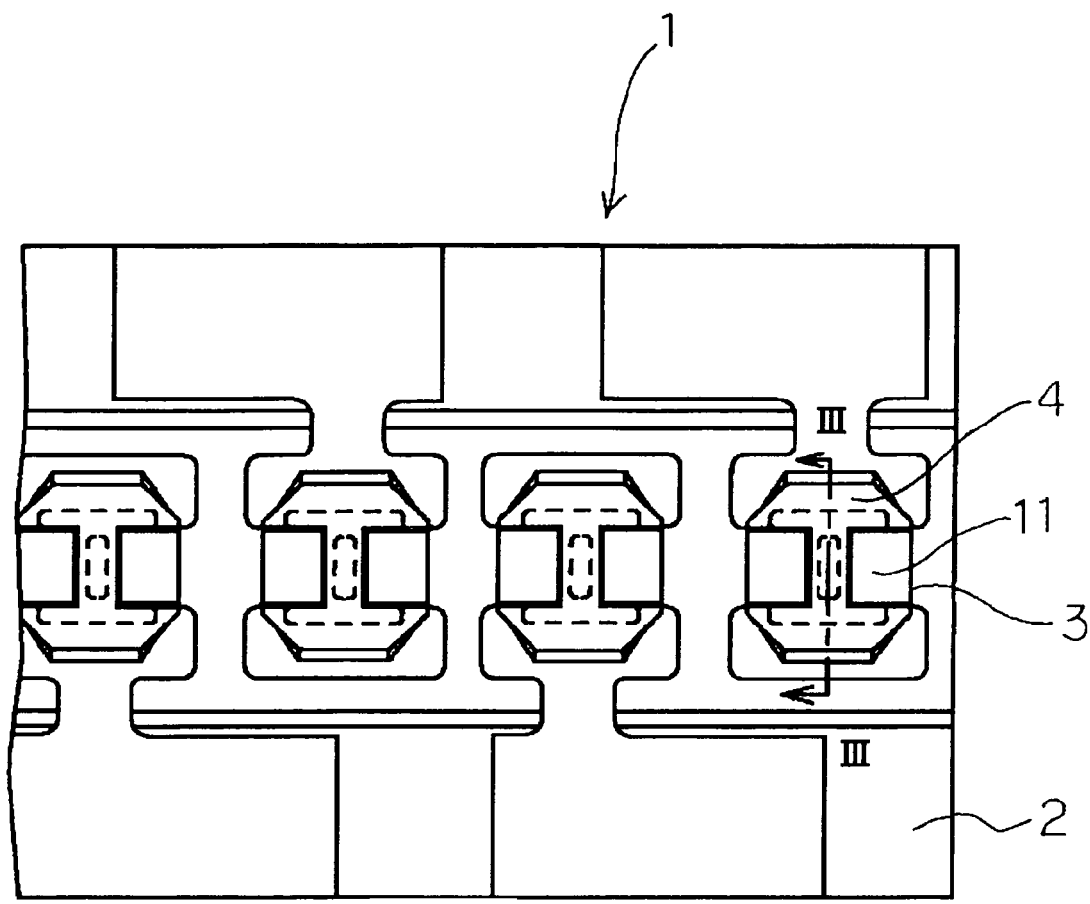
FIG. 1 is a schematic top view of an example of the light-emitting diode array according to the present invention.

KEY TO SYMBOLS 1 light-emitting diode array
2 base
3 light-emitting unit

4 P-electrode layer
11 light emitting window
15 angle-beveled shape
101 conventional light-emitting diode array
102 conventional base
103 conventional light-emitting diode
104 conventional P-electrode layer
111 conventional light emitting window

BEST MODE FOR CARRYING OUT THE INVENTION

Examples of the light-emitting diode array according to the present invention will be described in detail hereinafter with reference to the drawings. FIG. 1 is a schematic top view of an example of the light-emitting diode array according to the present invention. This light-emitting diode array 1 is composed of a base 2 that includes a substrate, an N-electrode layer, a buffer layer, a distributed Bragg reflector layer, and an insulating film; a plurality of platform-shaped light-emitting units 3 formed in the upper surface portion by, for example, mesa etching so as to be isolated from each other; and P-electrode layers 4.

The shape of each of the plurality of light-emitting units 3 is such that the light-emitting units having a substantially square shape as viewed from above are provided with beveled corners. Light emitting windows 11 in two positions of the light-emitting units 3 are disposed adjacent to each other at a prescribed interval in the transverse direction.

P-electrode layers 4 are layers on the outside of light-emitting units 3, are alternately drawn out in opposite directions at right angles to the positioning in the traverse direction of the light-emitting units 3 for each light-emitting diode, and are connected to a bonding wide-area electrode.

Figure 2A:
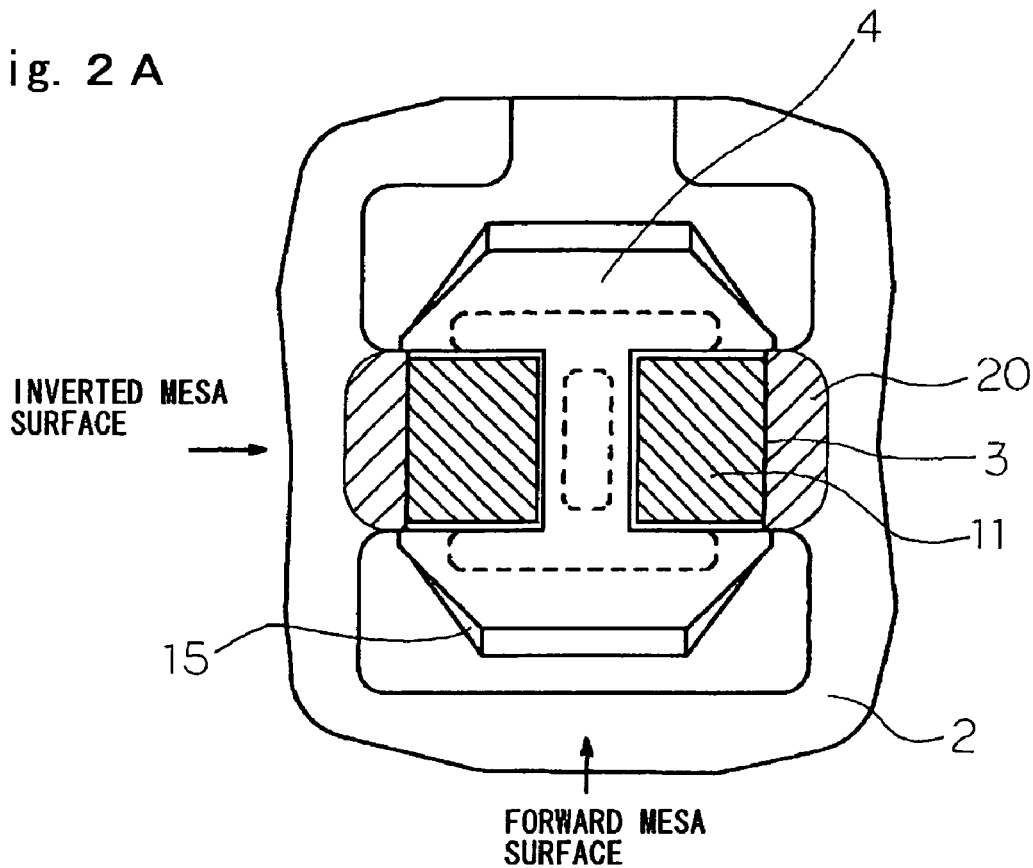
FIG. 2A is a top view of the light-emitting diode.
Figure 2B:
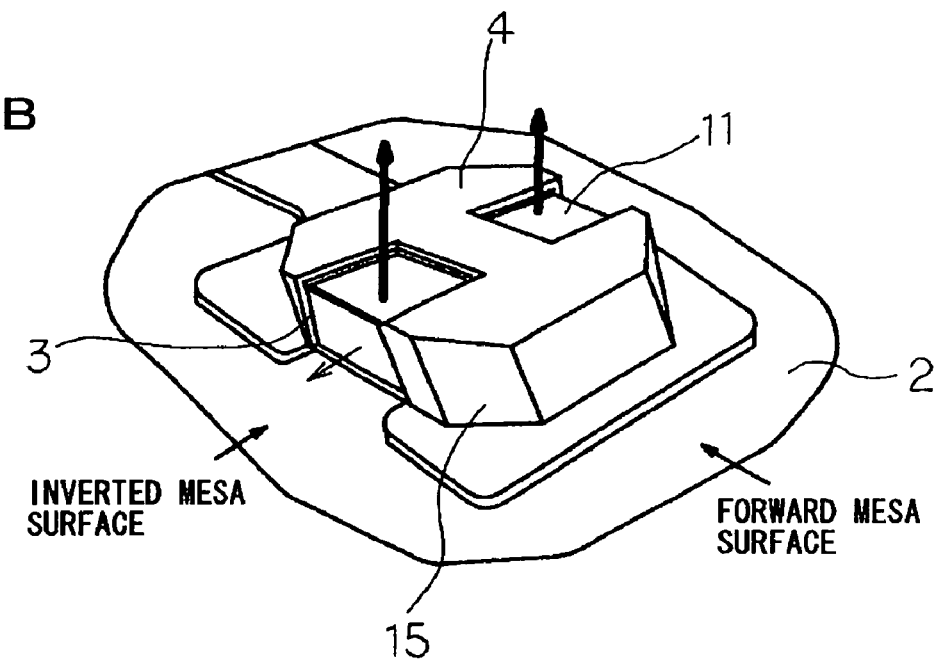
FIG. 2B is a perspective view of the same.

FIG. 2 includes schematic views of one light-emitting diode constituting the light-emitting diode array 1; wherein FIG. 2A is a top view of the light-emitting diode, and FIG. 2B is a perspective view of the same. The light-emitting unit 3 of this light-emitting diode is substantially square-shaped as viewed from above, and is mesa-etched so that the sides of the light emitting windows 11 arranged in two positions in the transverse direction form inverted mesa surfaces (surfaces that belong to a pair of opposing side surfaces and tilt inward from top to bottom), and forward mesa faces (surfaces that belong to a pair of opposing side surfaces and tilt outward from top to bottom) are formed in the orthogonal direction. Each of the four corners of the four peripheral side surfaces is beveled.

The P-electrode layer 4 in this example is an I-beam-shaped layer as viewed from above with the light emitting windows 11 in the open portions thereof, and extends from the center of one end on the outside to form a bonding wide-area electrode. Furthermore, the P-electrode layer 4 has an electrode formed in the forward mesa surfaces (surfaces that belong to a pair of opposing side surfaces and tilt outward from top to bottom), and is formed to wrap around the areas near the corners of the inverted mesa surfaces (surfaces that belong to a pair of opposing side surfaces that are adjacent to the pair of opposing side surfaces, and that tilt inward from top to bottom) so as to connect to the electrode provided to the forward mesa surfaces (surfaces that belong to the pair of opposing side surfaces and tilt outward from top to bottom). This P-electrode layer 4 also serves to block unnecessary light during light emission by the light-emitting unit 3 by covering the forward mesa surfaces on both sides and blocking light emitted from the forward mesa surfaces.

As is clear from FIGS. 2A and 2B, each end portion in the I-beam shape of the P-electrode layer 4 covers the portions near the corners of the inverted mesa surfaces all the way to the base 2 continuously from the forward mesa surfaces on both sides.

As a result, when light is emitted by the light-emitting diode, the light from the light emitting windows 11 exits upward from a pair of positions (see FIG. 2B). A portion of the light from the light emitting windows 11 tends to leak from the periphery of the inverted mesa surface, but since the regions having an angle-beveled shape 15 near the four corner positions in both directions of the inverted mesa surfaces are covered by the P-electrode layer 4 as shown in FIG. 2A in each of the light-emitting units 3 of the light-emitting diode array 1 of the present invention, light leakage does not occur except in the light leakage range 20 near the light emitting windows 11.

Figure 10A:
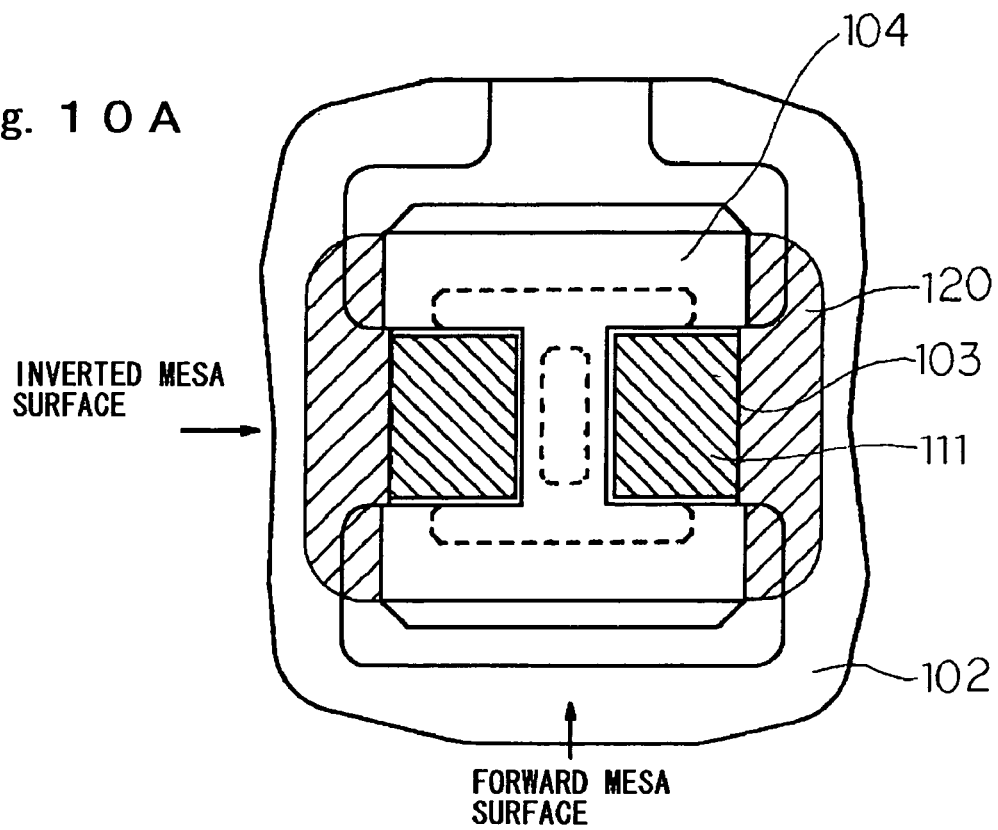
FIG. 10A is a top view of the light-emitting diode.
Figure 10B:
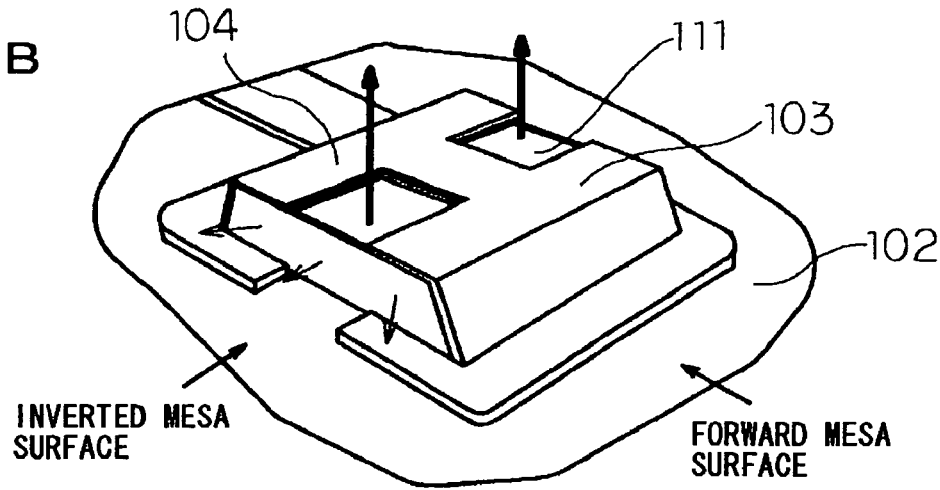
FIG. 10B is a perspective view of the same.
Figure 11:
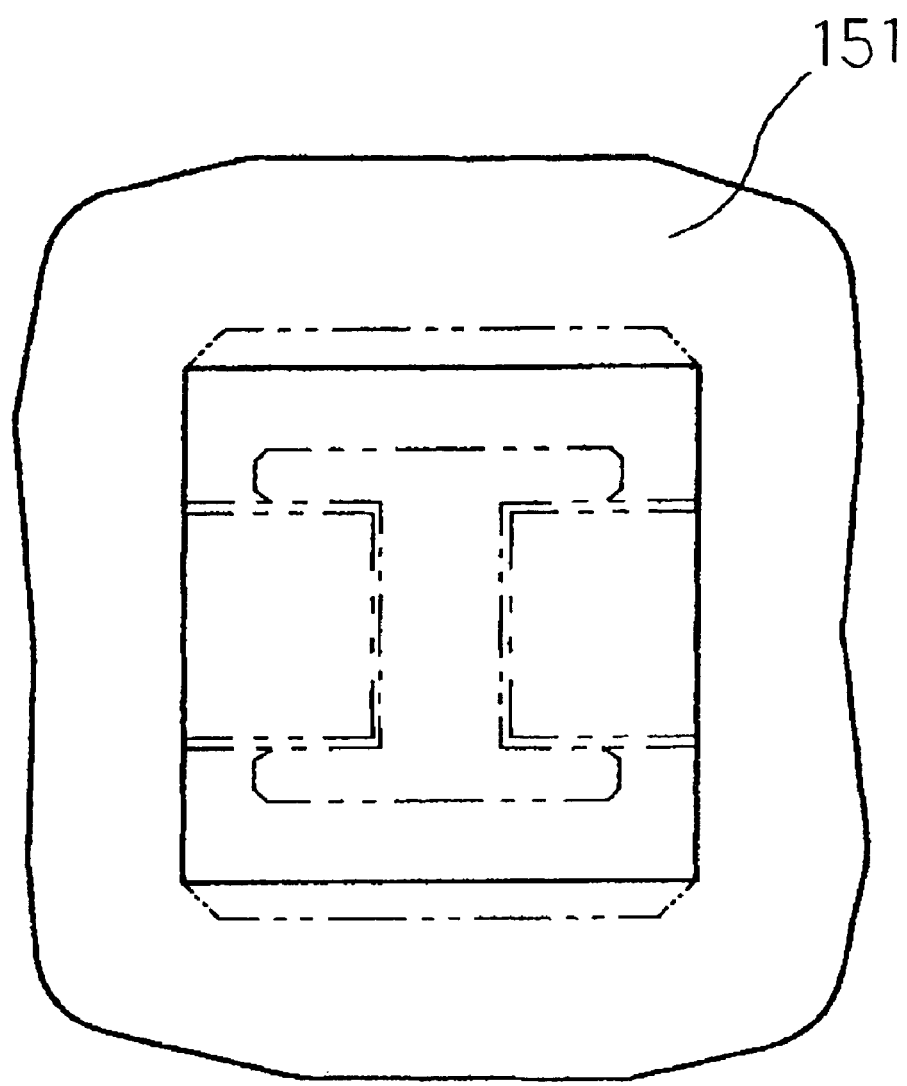
FIG. 11 is a schematic top view of the photomask shape in a case in which a conventional light-emitting unit (light-emitting diode) is mesa-etched.

The light leakage range 20 has a small area that extends to substantially the same width as the light emitting windows 11, and produces a nearly ideal spot light source. The significance of these effects is easily understood by comparing the light leakage range 20 with the outward size of the light leakage range 120 shown in FIG. 10A, which shows the light leakage of the conventional light-emitting diode.

The fabrication process for the light-emitting diode array according to the present invention will next be described using FIGS. 3, 4, and 5. FIGS. 3 through 5 are views of the manufacturing process of the light-emitting diode array according to the present invention, and are sectional views along line III-III in FIG. 1.

Figure 3A:
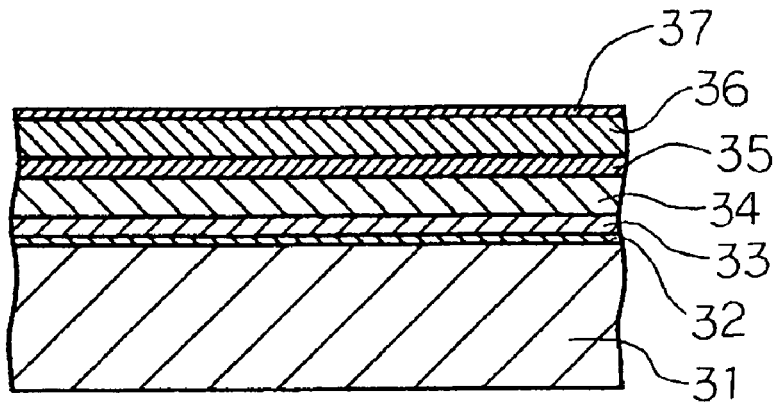
FIG. 3A is a view of the epitaxial growth process.

When the light-emitting diode array according to the present invention is manufactured, layers are first formed by epitaxial growth on a GaAs substrate 31 as shown in FIG. 3A.

Examples of epitaxial growth methods that may be used include VPE (Vapor-Phase Epitaxial) methods, MOVDE (Metal Organic Vapor Deposition Epitaxial) methods, MOCVD (Metal Organic Chemical Vapor Deposition Epitaxial) methods, MBE (Molecular Beam Epitaxial) methods, MOMBE (Metal Organic Molecular Beam Epitaxial) methods, CBE (Chemical Beam Epitaxial) methods, and other methods.

An N-buffer layer 32 composed of GaAs, a DBR layer (Distributed Bragg Reflector: distributed Bragg reflecting layer) 33, an N-cladding layer 34 composed of AlGaAs, an active layer 35, a P-cladding layer 36 composed of AlGaAs, and a P-contact layer composed of GaAs are then formed by epitaxial growth on an N-substrate 31 composed of GaAs. The layers described above are merely examples, and it is also possible to use a P-substrate or materials other than AlGaAs.

Figure 3B:
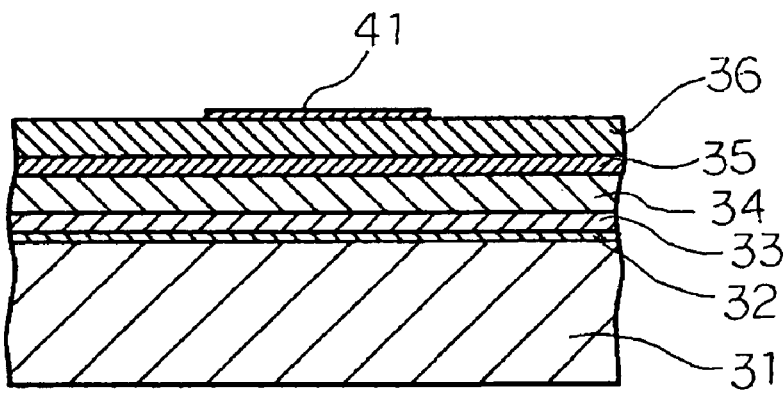
FIG. 3B shows the formation of a contact portion.

A contact portion is then formed as shown in FIG. 3B. The contact portion 41 is formed, for example, by a process of photolithography and etching. Ammonia is also used during etching.

Figure 3C:
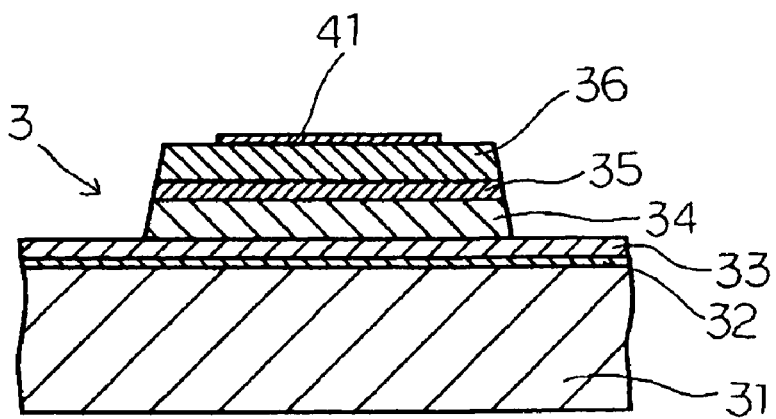
FIG. 3C shows the formation of the light-emitting unit by mesa etching.

A light-emitting unit is then formed by mesa etching as shown in FIG. 3C. This light-emitting unit 3 is formed, for example, by a process of photolithography and etching. Phosphoric acid, for example, is used during etching. The etching conditions are adjusted so that prominent anisotropic etching occurs during the mesa etching. The shape of the photomask used in this etching will be described hereinafter.

Figure 4A:
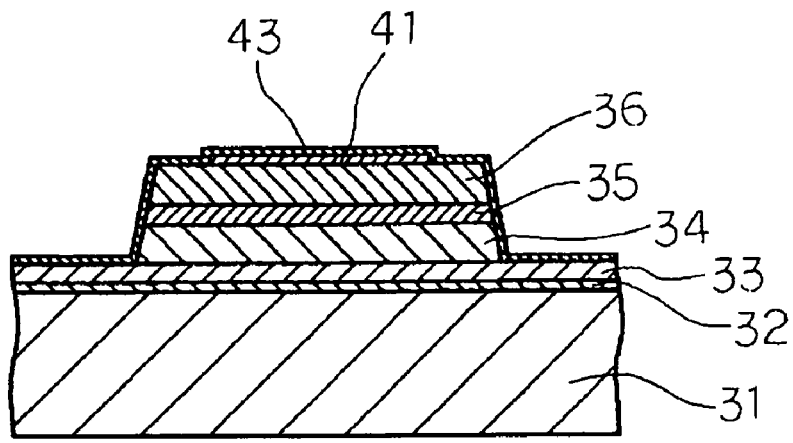
FIG. 4A shows the formation of an insulating film.
Figure 5:
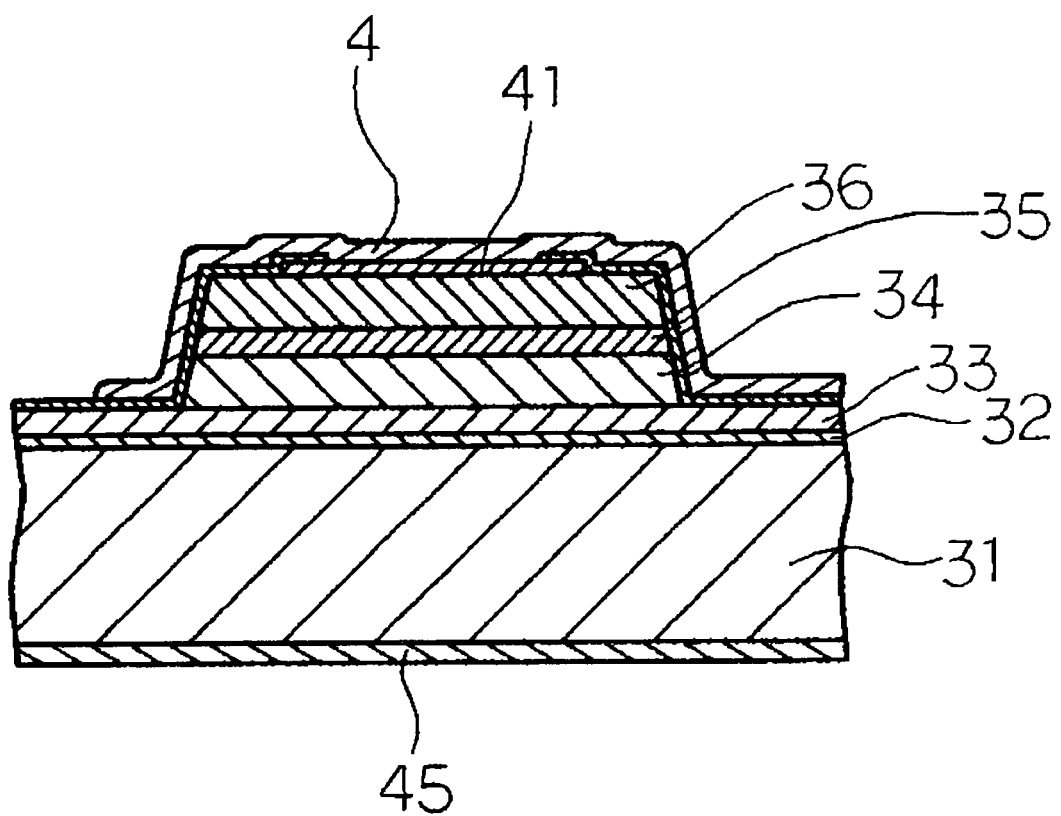
FIG. 5 is a schematic partial sectional view of the fabrication process of the light-emitting diode according to the present invention, and shows the formation of an N-electrode layer.

An insulating film is then formed as shown in FIG. 4A. For example, an insulating layer 43 is formed from a $Si_3N_4$ film, for example. The insulating layer 43 may also be formed from a $SiO_2$ film or an $Al_2O_3$ film.

Figure 4B:
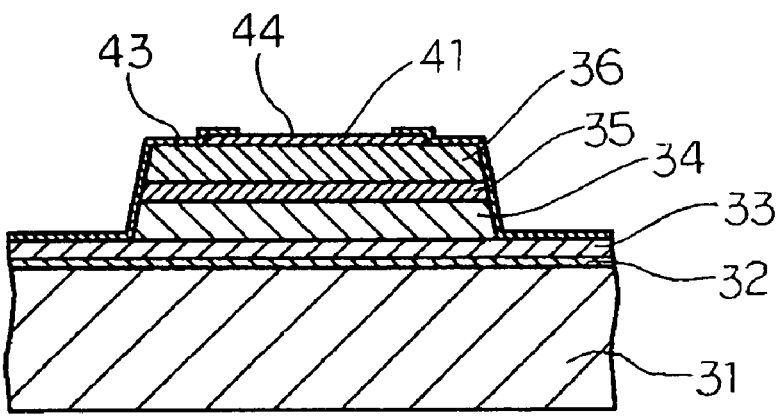
FIG. 4B shows the formation of a contact hole.

A contact hole is then formed as shown in FIG. 4B. A process of photolithography and etching, for example, is used to form the contact hole 44. The contact hole 44 is formed by CF$_4$ plasma etching, for example.

Figure 4C:
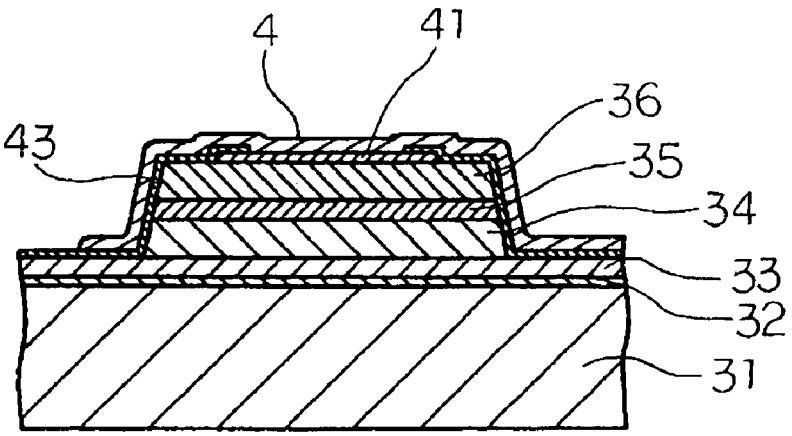
FIG. 4C shows the formation of a P-electrode layer.

A P-electrode layer is then formed as shown in FIG. 4C. The P-electrode layer 4 is formed by a liftoff method, for example, over the contact hole formed in FIG. 4B, and is configured so that an electric current can flow through the contact hole. The material used to form the P-electrode layer 4 is a Ti/Au/Zn/Au (total thickness: 1 µm) or other Au alloy, for example.

An N-electrode layer is then formed as shown in FIG. 5. The N-electrode layer 45 is formed on the lower surface of the substrate, and the material used therein is an Au/Te/Sn/Au (total thickness: 0.8 µm) or other Au alloy.

Figure 6:
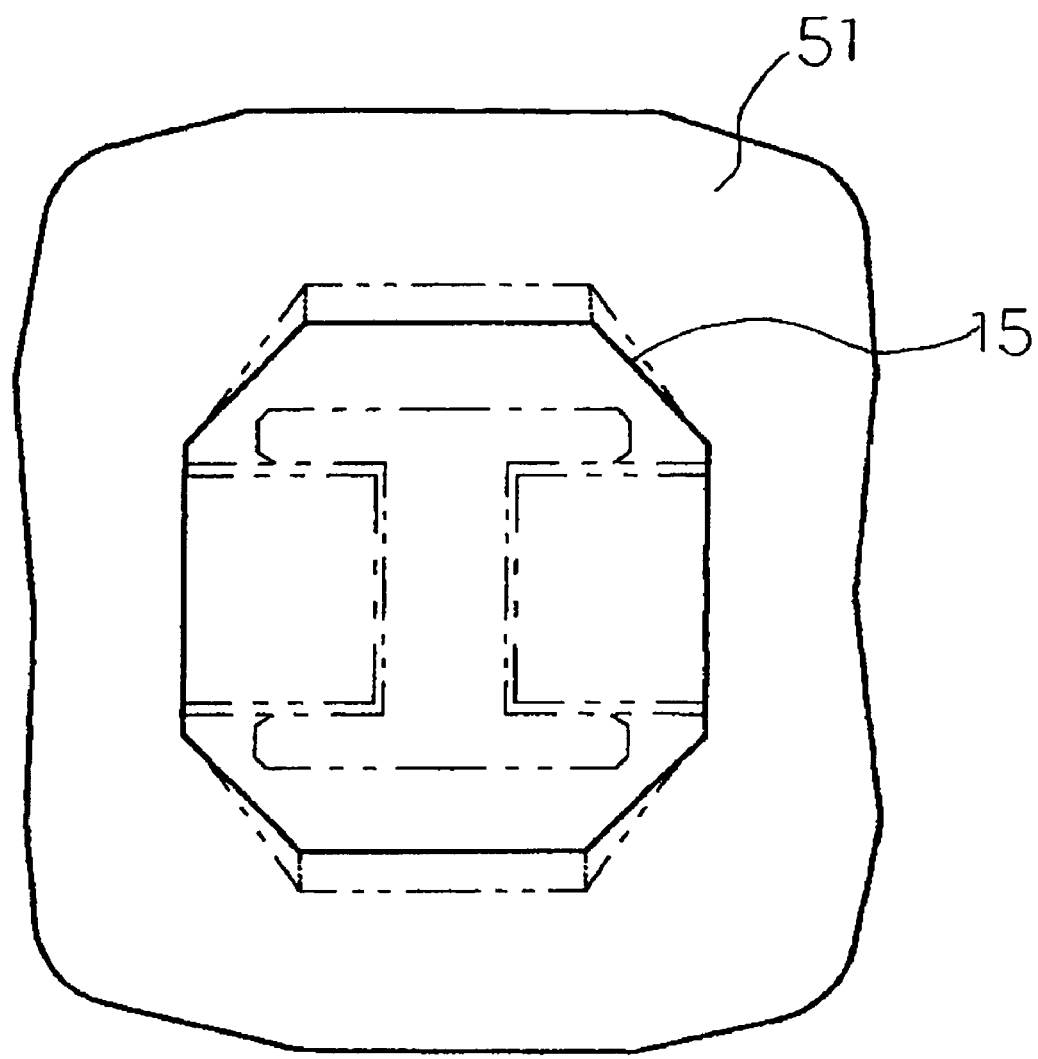
FIG. 6 is a top view showing a photomask shape for creating an angle-beveled shape in the light-emitting diode according to the present invention.

The shape of the photomask used to form the light-emitting unit 3 will next be described. FIG. 6 is a top view showing a photomask shape for creating an angle-beveled shape. The photomask 51 is shaped so as to give the substantially square corner portions an angle-beveled shape 15 in the positions of the light-emitting diodes, and the light-emitting units 3 are formed by mesa etching according to the shape of the photomask.

Figure 7:
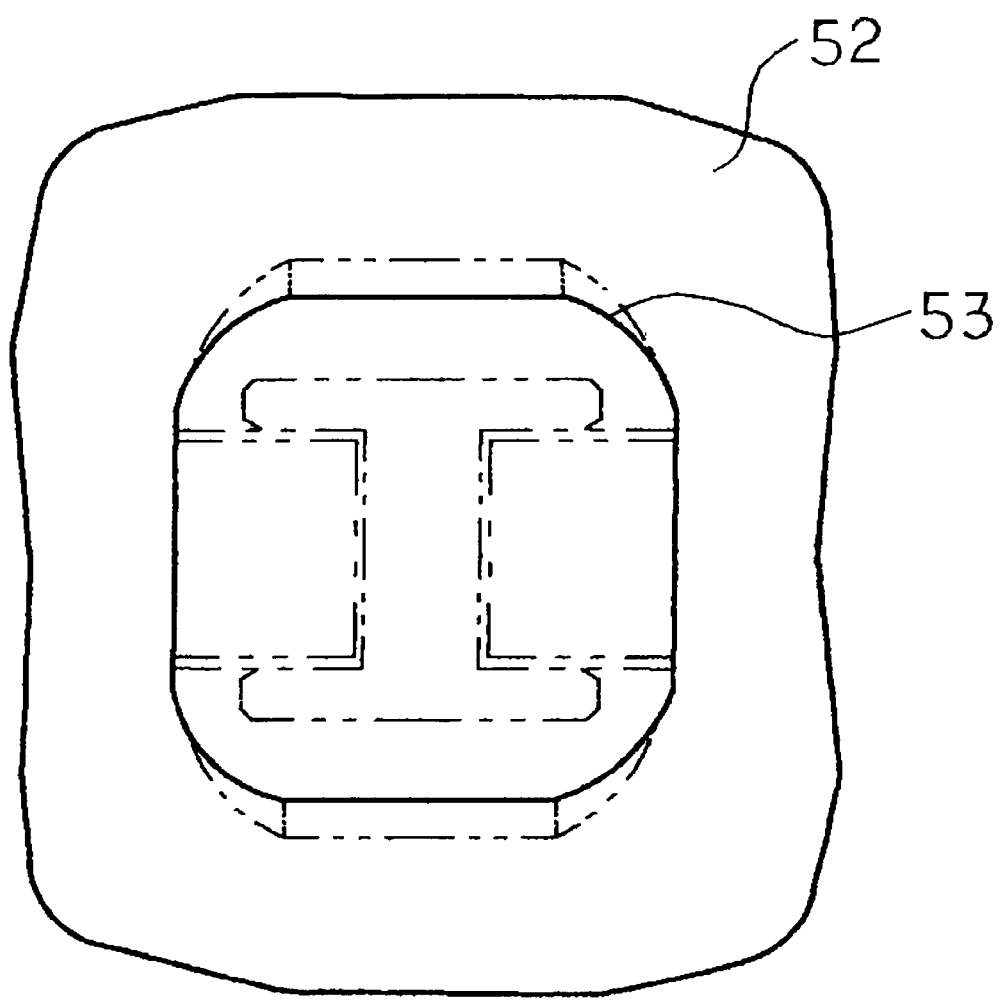
FIG. 7 is a top view showing a photomask shape for creating a round-beveled shape in the light-emitting diode according to the present invention.

FIG. 7 is a top view showing a photomask shape for creating a round-beveled shape. The photomask 52 is shaped so as to give the substantially square corner portions a round-beveled shape 53, and light-emitting units 3 whose corners have a round-beveled shape are formed by mesa etching according to the shape [of the photomask].

In the light-emitting diode array 1 according to the present invention as described above, the shape of the light-emitting unit 3, which is substantially square as viewed from above in each of the plurality of light-emitting diodes constituting the light-emitting diode array 1, is such that the corner portions are angle-beveled or round-beveled. As shown in FIG. 2, when the P-electrode layer is formed, the angle of the mesa surfaces thus varies gradually and in sequence from the forward mesa surfaces, in which the rising angle from the base 2 is obtuse, to the inverted mesa surfaces, in which the rising angle is acute. Therefore, the P-electrode layer 4 can easily wrap around and cover the corners (i.e., the inverted mesa surfaces near the corners). As a result, light from the corners is blocked, and light leakage from the corners can be eliminated.

Since the P-electrode layer of the light-emitting diode surrounds three sides of the light-emitting unit 3 and extends continuously from the forward mesa surfaces to the base of the inverted mesa surfaces near the corners, light can also be blocked from these covered portions.

Figure 8:
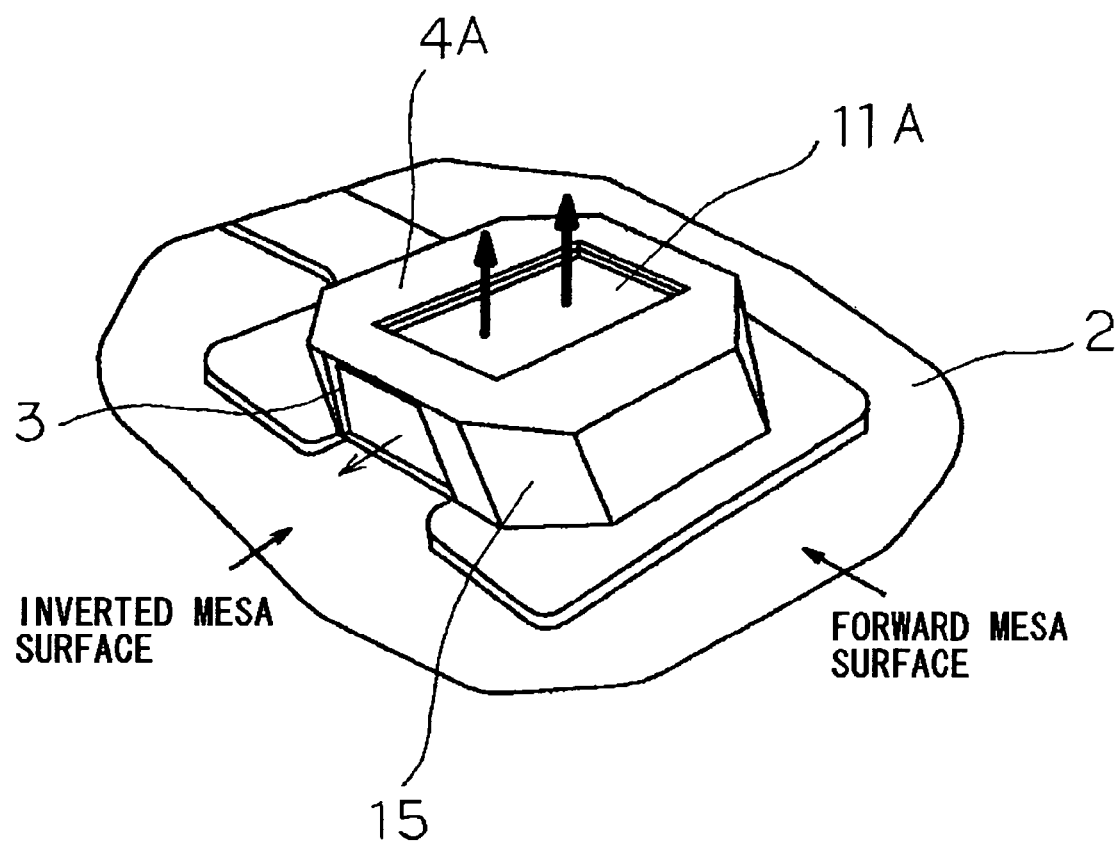
FIG. 8 is a schematic perspective view of another example of the light-emitting diode according to the present invention.
Figure 9:
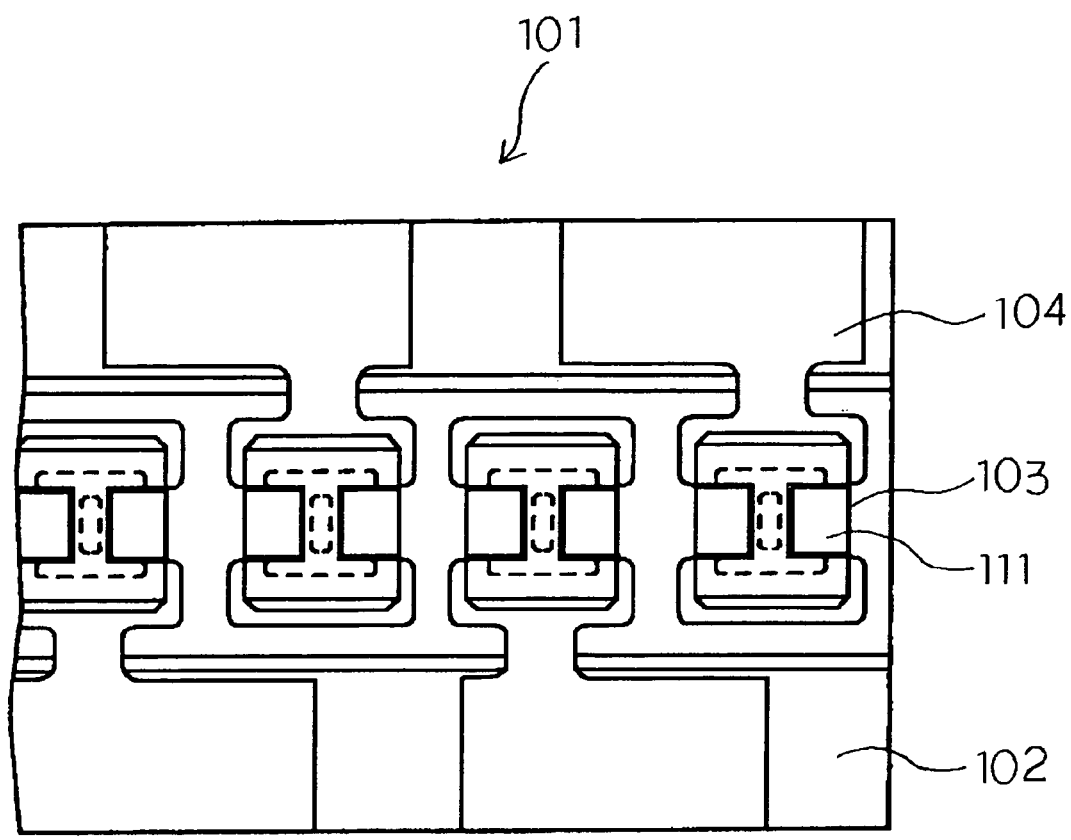
FIG. 9 is a schematic top view of a conventional mesa-isolated light-emitting diode array.

An example in which an I-beam-shaped P-electrode layer 4 covered the light-emitting unit 3 was described as a best mode for carrying out the invention described above. However, this is merely an example, and the P-electrode layer for covering the light-emitting unit 3 of each light-emitting diode of the light-emitting diode array according to the present invention may be a P-electrode layer 4A having an open portion (light emitting window 11A) with a rectangular shape or other closed frame shape on the upper surface of the light-emitting unit 3, as shown in FIG. 8.

An example in which an I-beam-shaped P-electrode layer 4 covered the light-emitting unit 3 was described as a best mode for carrying out the invention described above. However, this is merely an example, and the invention may be carried out using another light-blocking film having the same shape instead of the P-electrode layer.

Furthermore, adopting a configuration in which the shape of the corners of the light-emitting unit can be selected according to the shape of the mask pattern used for mesa etching provides effects whereby there is no need to add more steps to the conventional fabrication process, and it is possible to freely select a corner shape for the light-emitting diode that is optimal for the conditions of the manufacturing process.

The light-emitting diode array or light-emitting diode configured as described above may be utilized as a writing light source for the print head or the like of an LED (light-emitting diode) printer.

INDUSTRIAL APPLICABILITY

Since there is minimal light leakage in the region of the inverted mesa surfaces at the corners in the light-emitting diode array or light-emitting diode of the present invention, significantly enhanced performance, particularly increased precision and increased density, can be achieved in a printer by utilizing the present invention in the print head or other component of an LED (light-emitting diode) printer, for example.

The invention claimed is:

1. A light-emitting diode array, comprising a plurality of platform-shaped light-emitting units formed so as to be isolated from each other by etching of layered PN layers on a surface of a substrate; wherein
    in each of said plurality of platform-shaped light-emitting units formed so as to be isolated from each other, corners of the light-emitting units having a substantially square shape as viewed from above are provided with a beveled shape and wherein the beveled shape of said corners is an angle-beveled shape or a round-beveled shape,
    wherein an electrode layer or a light-blocking film provided to each of said light-emitting units surrounds three sides, as viewed from above, of a light emitting window of each of said plurality of light-emitting units, and covers portions of a reverse mesa surface near said corners over an area that extends to a base.

2. A light-emitting diode comprising a light-emitting unit having four peripheral side surfaces, wherein
    a pair of opposing side surfaces from among said four peripheral side surfaces have surfaces that tilt outward from top to bottom;
    another pair of opposing side surfaces adjacent to said pair of opposing side surfaces from among said four peripheral side surfaces have surfaces that tilt inward from top to bottom;
    each of four corners of said four peripheral side surfaces is beveled; and
    an electrode is formed on each surface tilted outward from top to bottom of said pair of opposing side surfaces, and another electrode is formed in a wraparound fashion near corners of each surface tilted inward from top to bottom of said another pair of opposing side surfaces adjacent to said pair of opposing side surfaces, so as to connect to the electrode formed on said each surface tilted outward from top to bottom of said pair of opposing side surfaces.

3. A printer head characterized in comprising as a light source the light-emitting diode array or light-emitting diode according to claim 1 or 2.

4. A printer head characterized in comprising as a light source the light-emitting diode array according to claim 1.

* * * * *